United States Patent [19]
Cho et al.

[11] Patent Number: 5,888,869
[45] Date of Patent: Mar. 30, 1999

[54] METHOD OF FABRICATING A FLASH MEMORY DEVICE

[75] Inventors: Min Kuck Cho; Jong Oh Kim, both of Seoul, Rep. of Korea

[73] Assignee: Hyundai Electronics Industries, Co., Ltd., Kyungki-Do, Rep. of Korea

[21] Appl. No.: 879,419

[22] Filed: Jun. 20, 1997

[30] Foreign Application Priority Data

Jun. 27, 1996 [KR] Rep. of Korea .................. 1996 24393

[51] Int. Cl.$^6$ .............................................. H01L 21/8247
[52] U.S. Cl. ........................................... 438/258; 438/275
[58] Field of Search ................................... 438/257–267, 438/275; 257/316

[56] References Cited

U.S. PATENT DOCUMENTS

| | | |
|---|---|---|
| 5,175,120 | 12/1992 | Lee . |
| 5,183,773 | 2/1993 | Miyata . |
| 5,292,681 | 3/1994 | Lee et al. . |
| 5,478,767 | 12/1995 | Hong . |
| 5,514,889 | 5/1996 | Cho et al. .............................. 257/316 |
| 5,658,812 | 8/1997 | Araki ..................................... 438/258 |
| 5,712,178 | 1/1998 | Cho et al. . |
| 5,723,355 | 3/1998 | Chang et al. . |

*Primary Examiner*—Richard A. Booth
*Attorney, Agent, or Firm*—Scott C. Harris, Esq.

[57] ABSTRACT

The present invention discloses a method of fabricating a flash memory device. In the present invention, since the dielectric film formed in the memory cell region is only exposed to the cleaning solution which is used in cleaning process preformed after removing the dielectric film formed in the low voltage transistor region, the number of damages applied to the dielectric film can be minimized, therefore, a good dielectric film can be obtained.

2 Claims, 12 Drawing Sheets

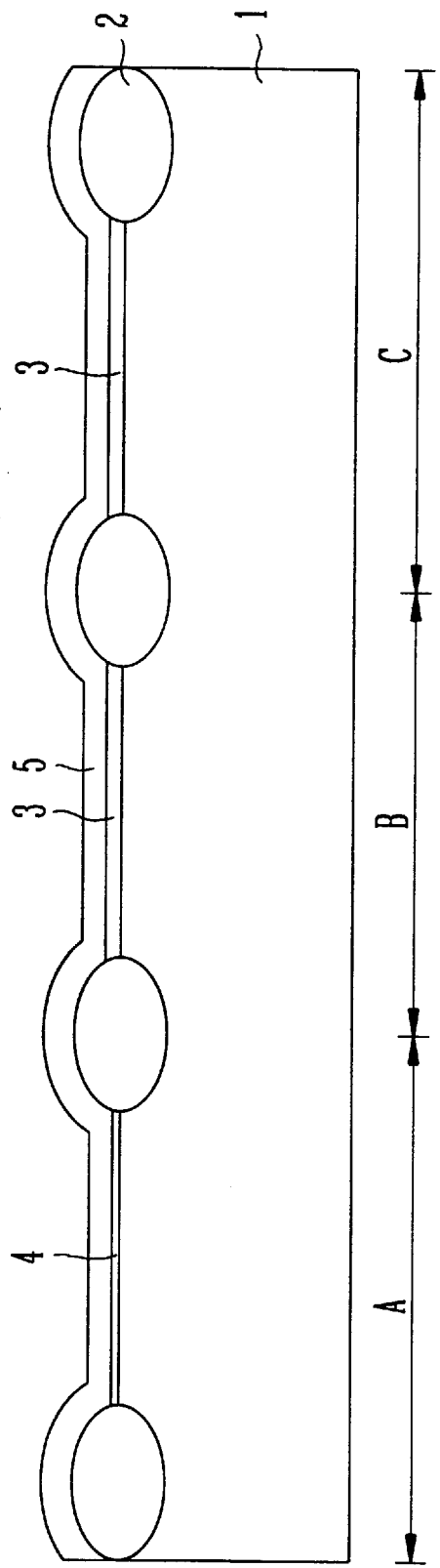
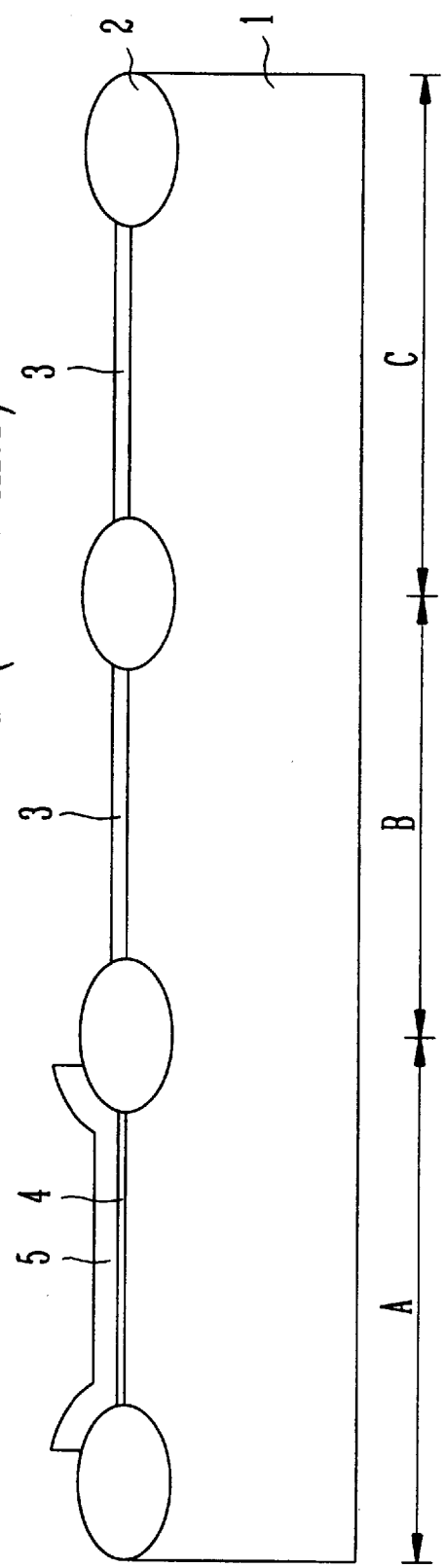
FIG. 1C (PRIOR ART)
FIG. 1D (PRIOR ART)

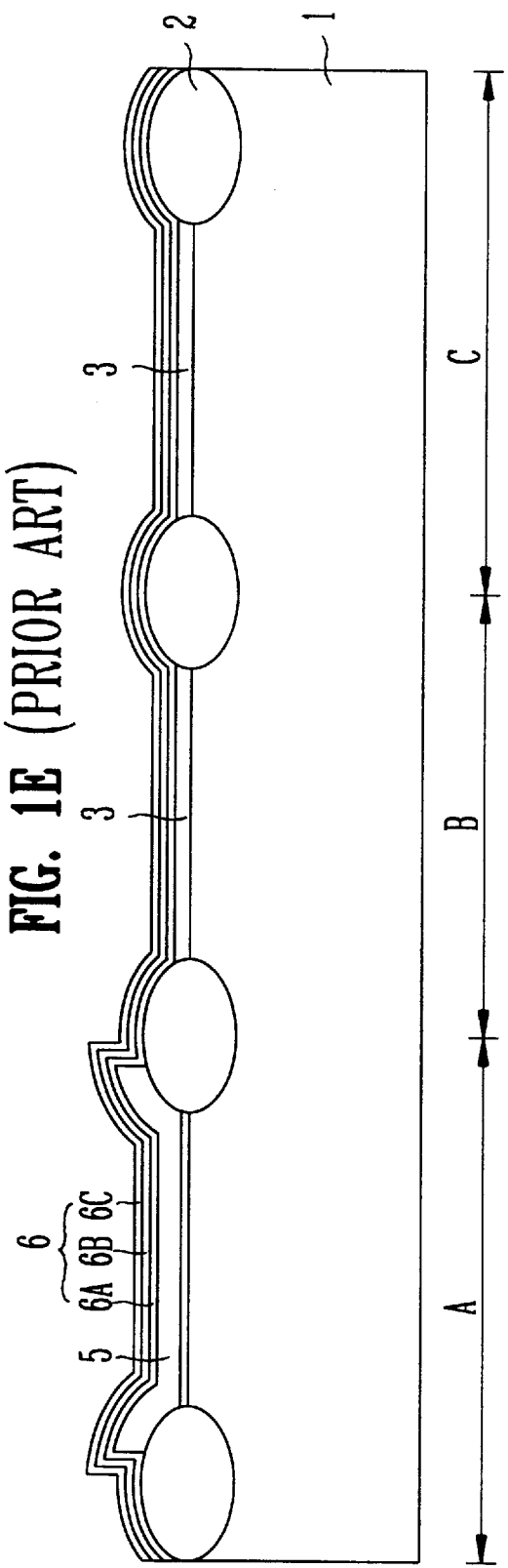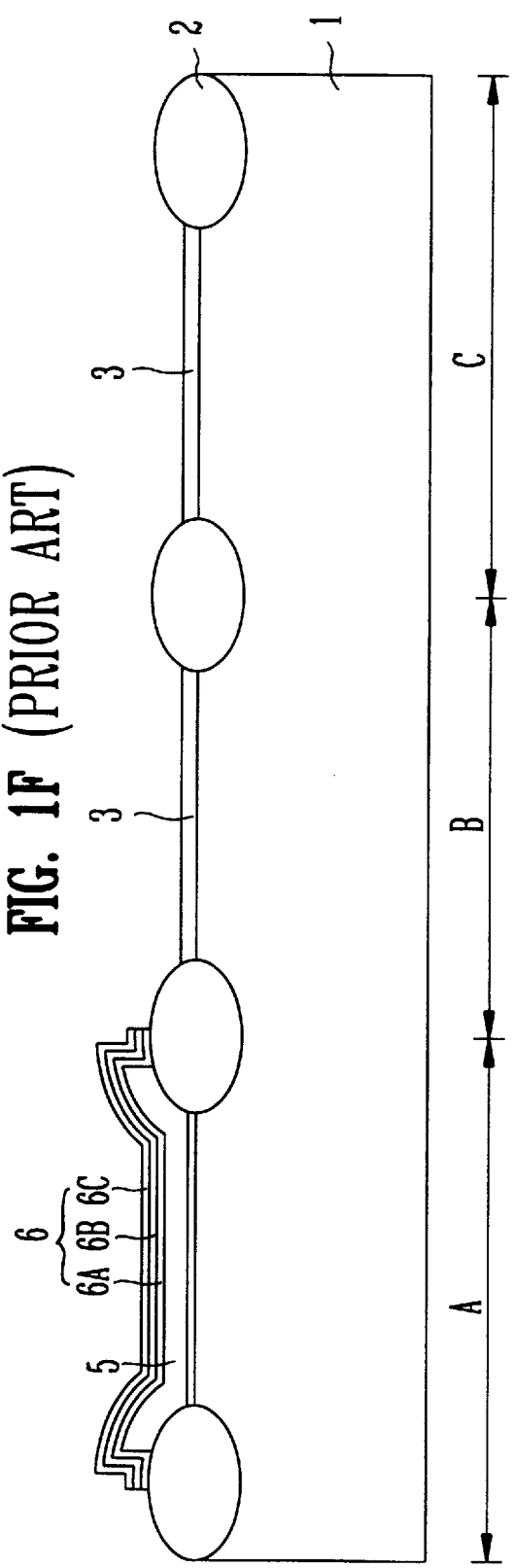

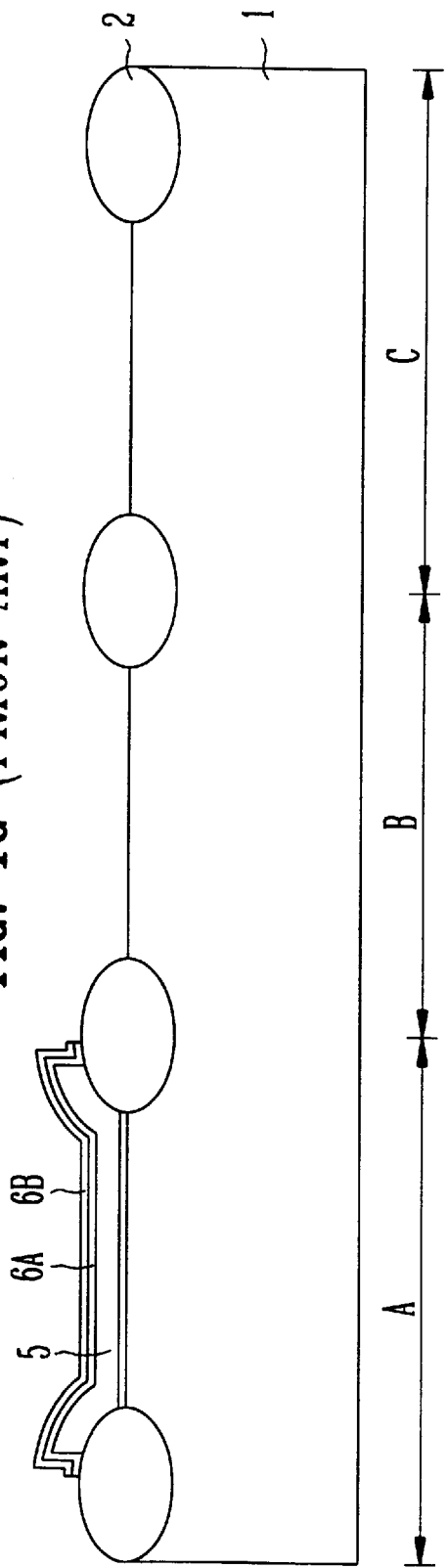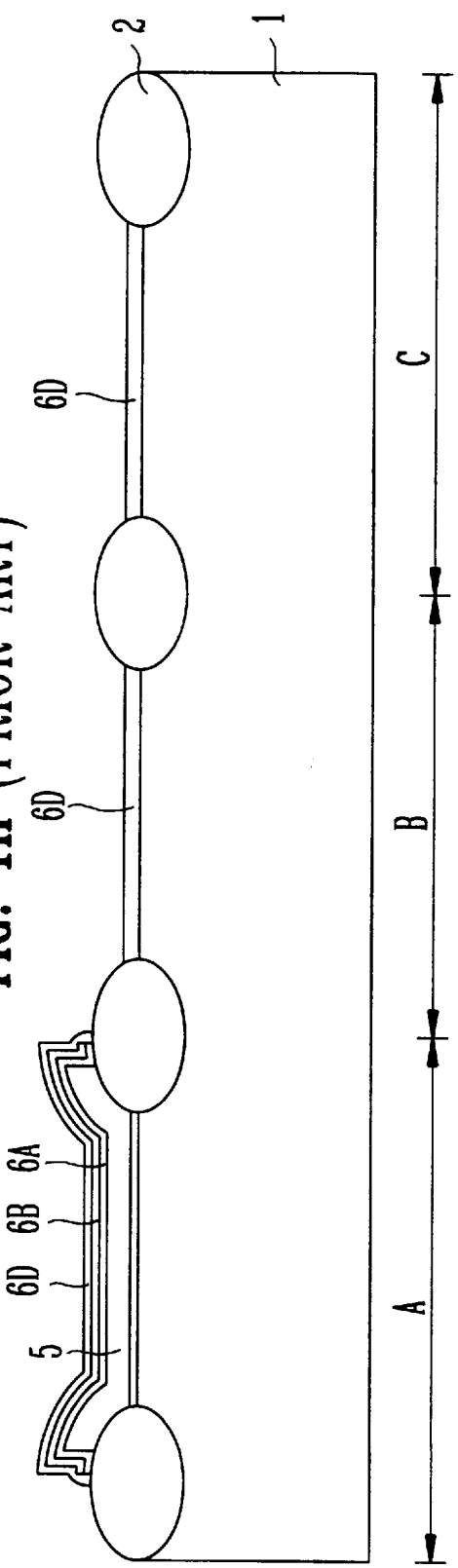

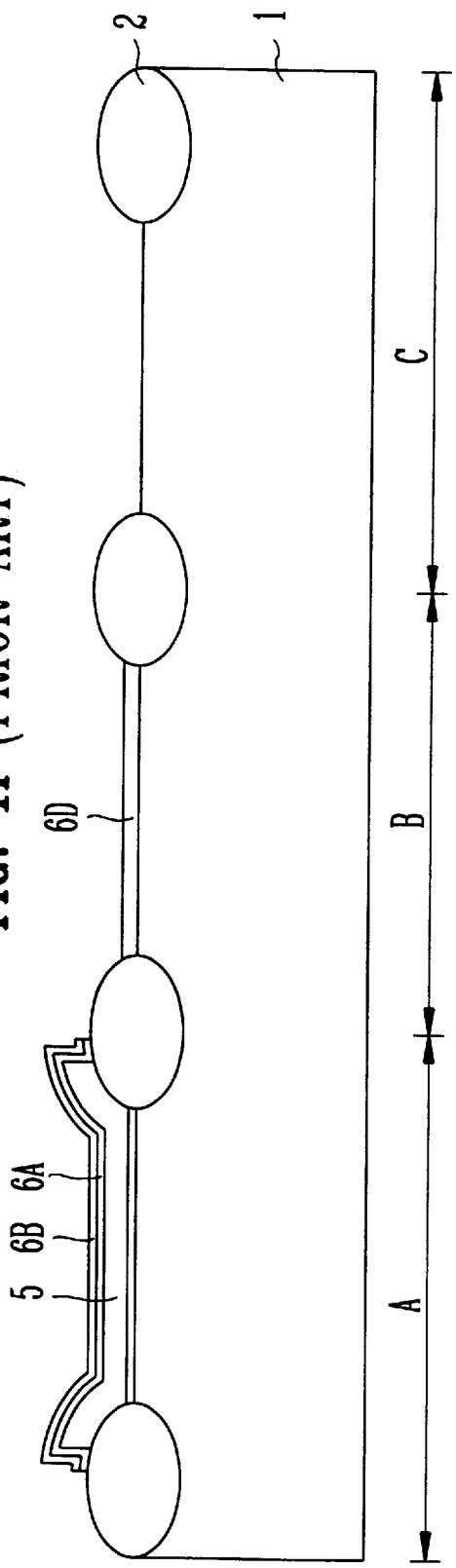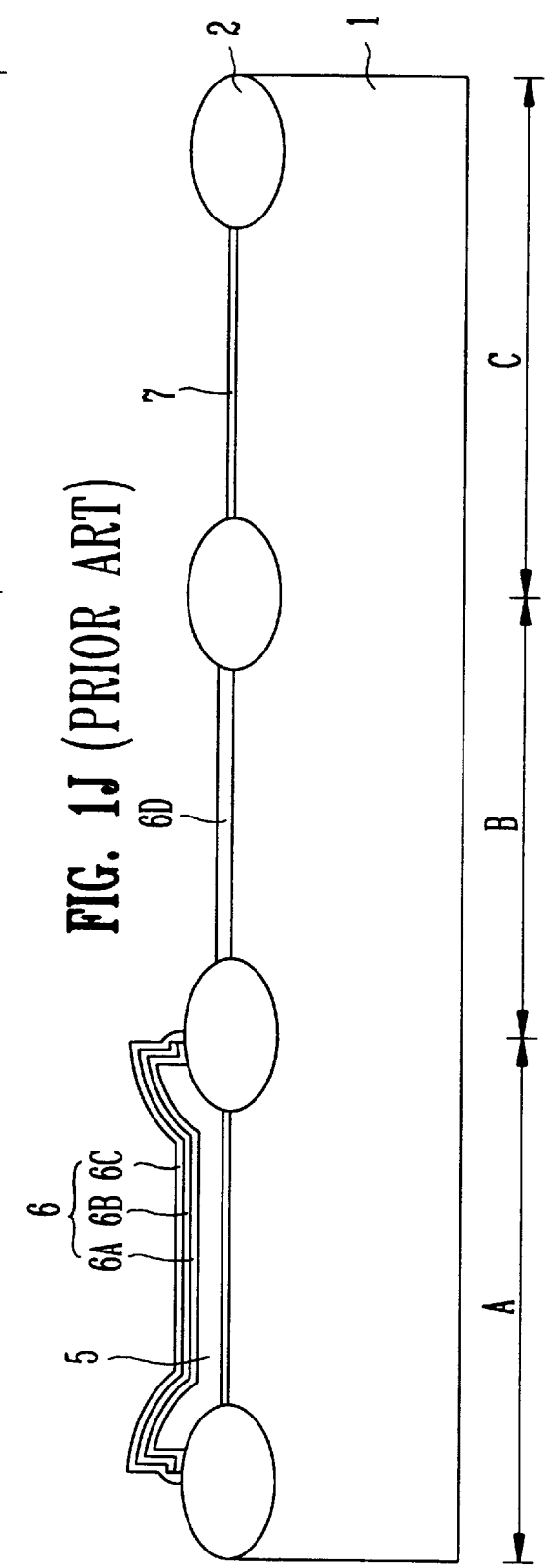

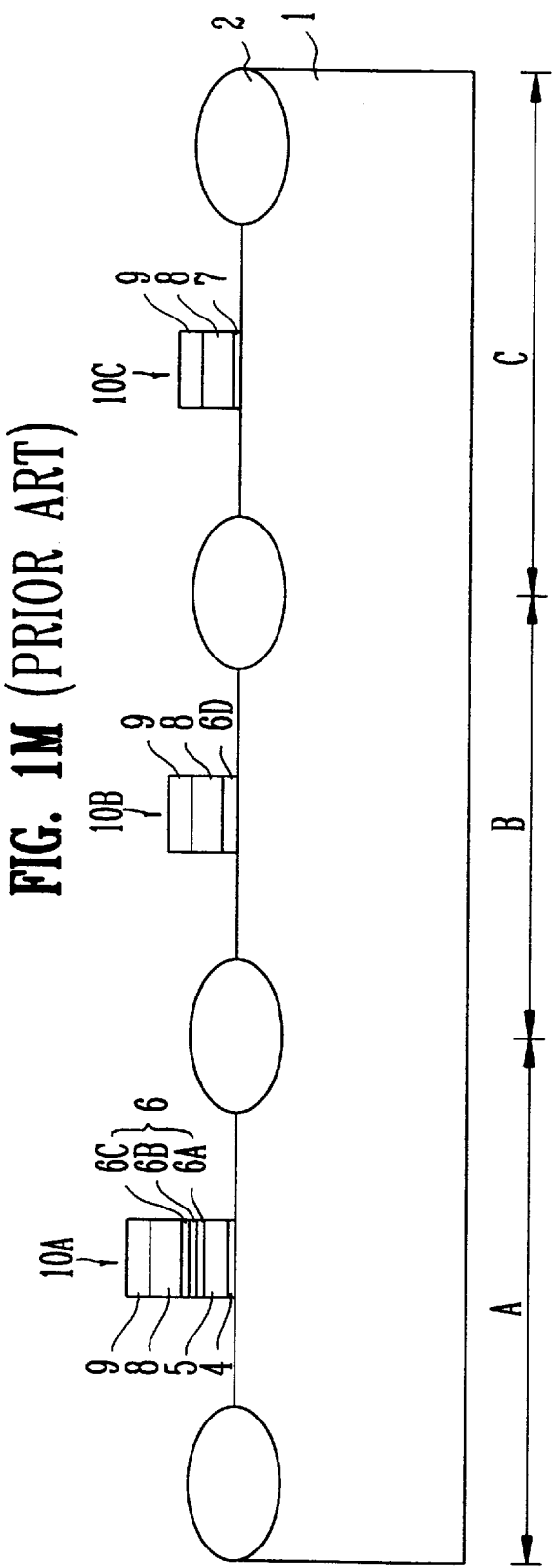
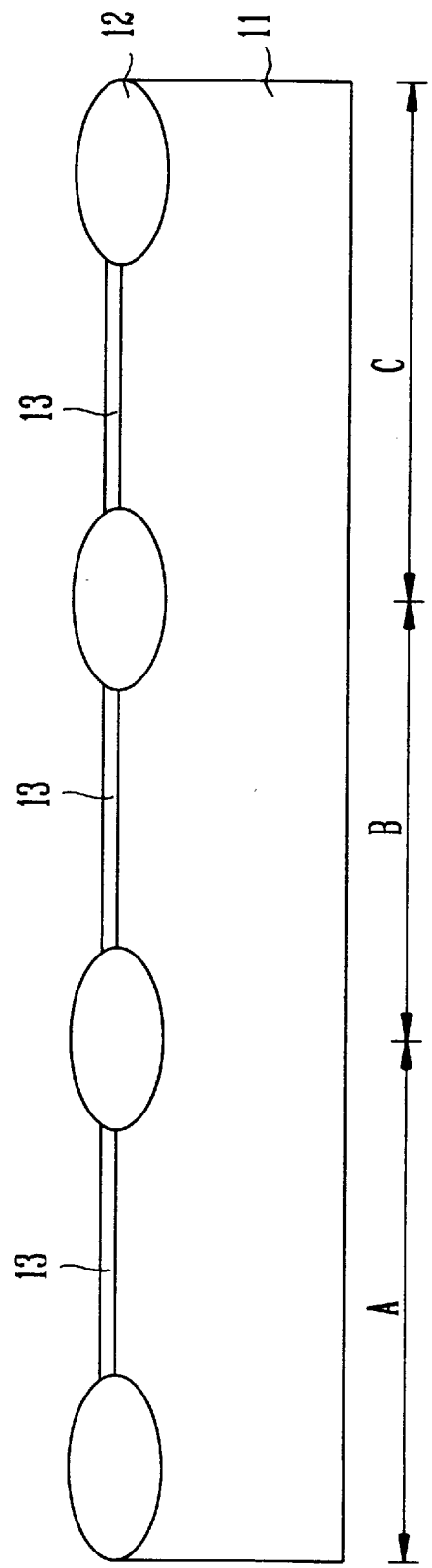
FIG. 1M (PRIOR ART)
FIG. 2A

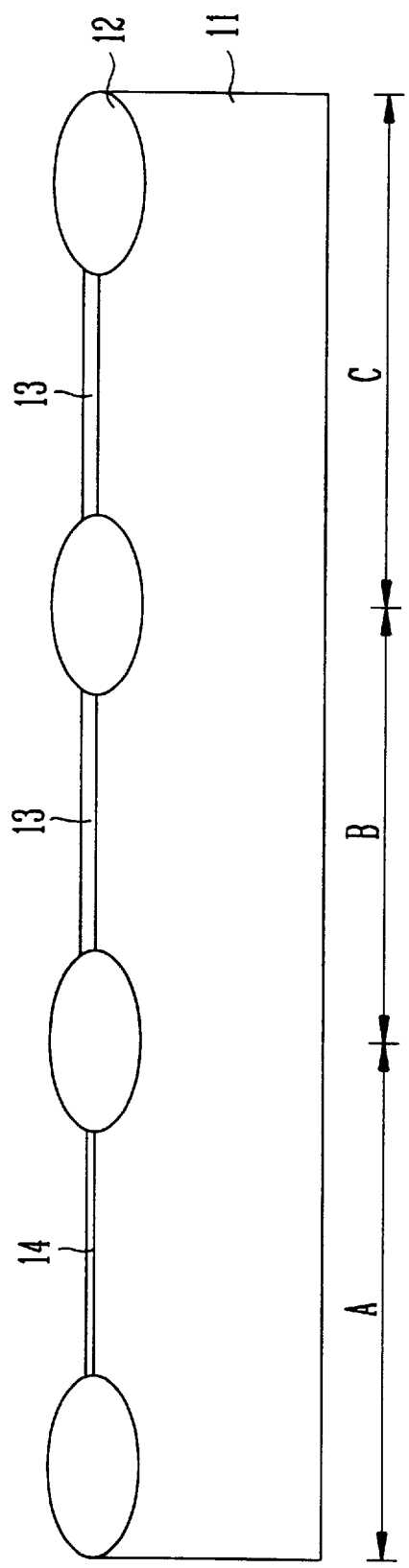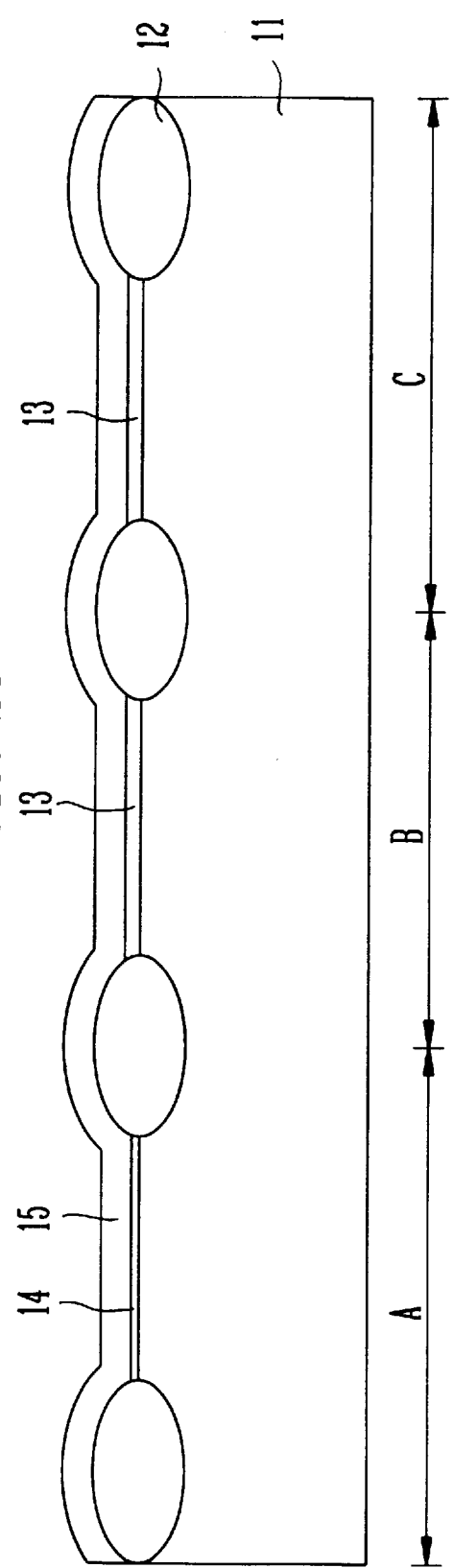

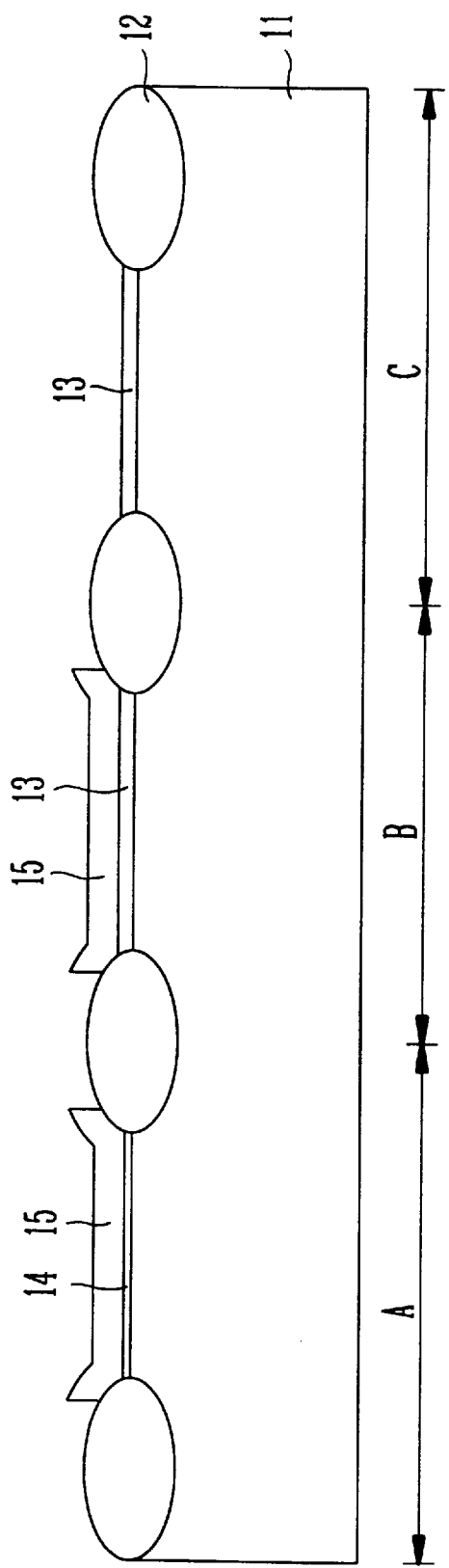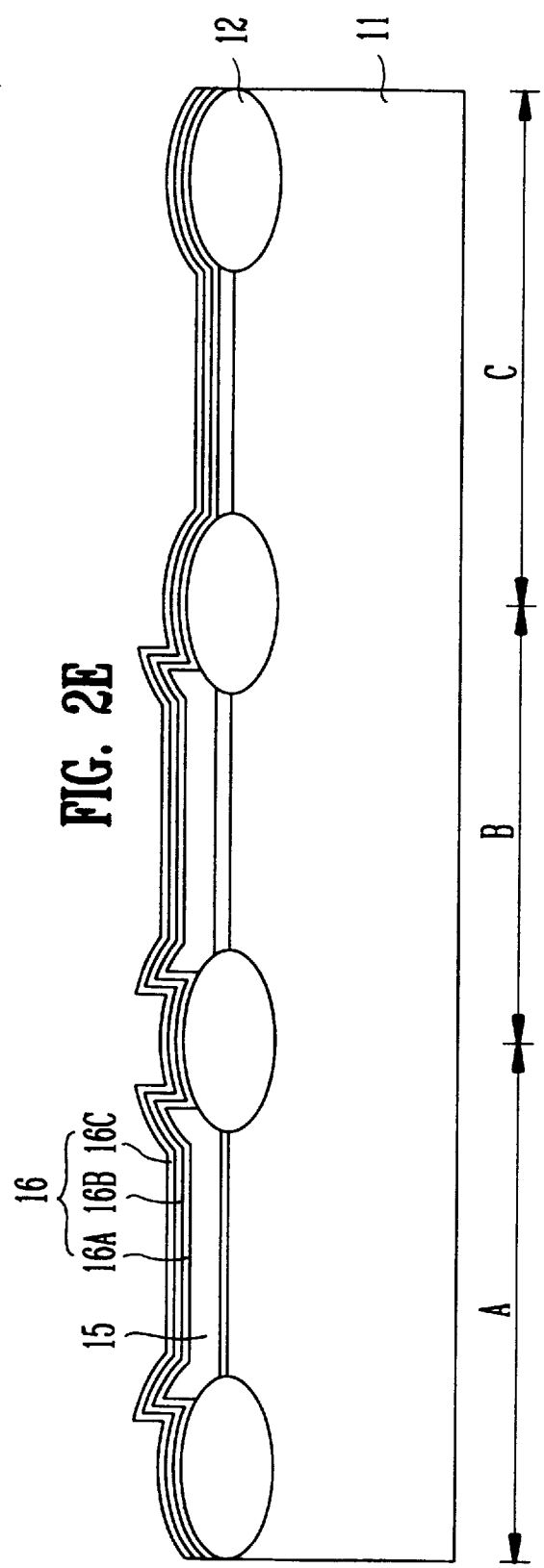

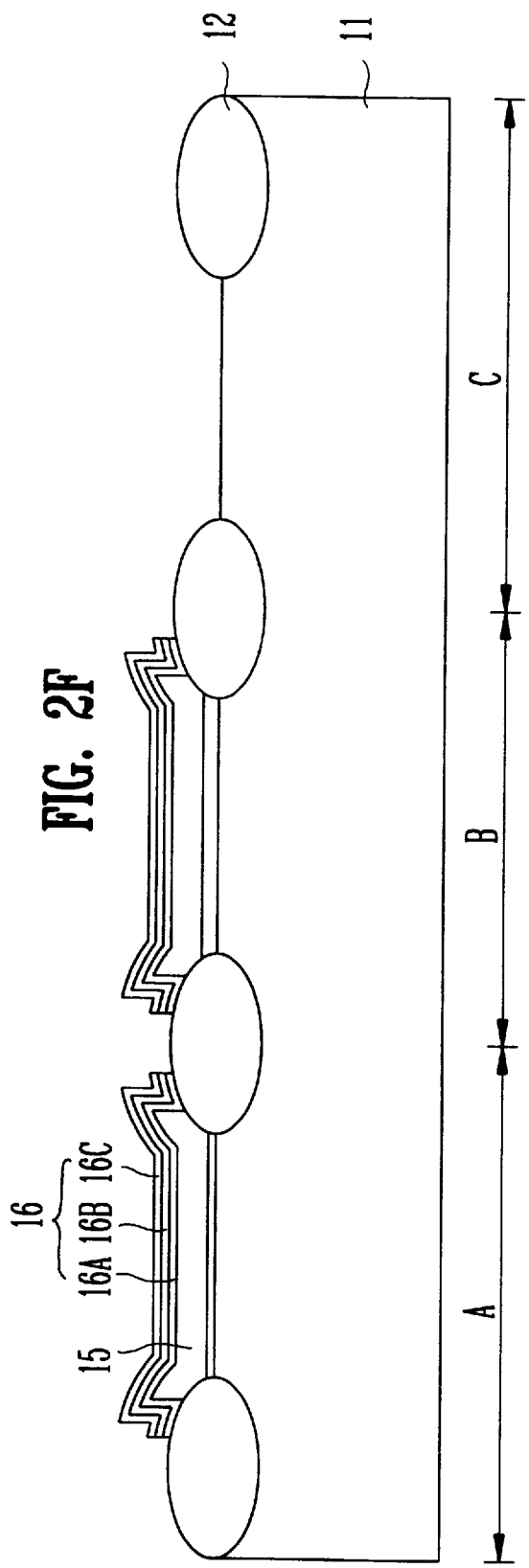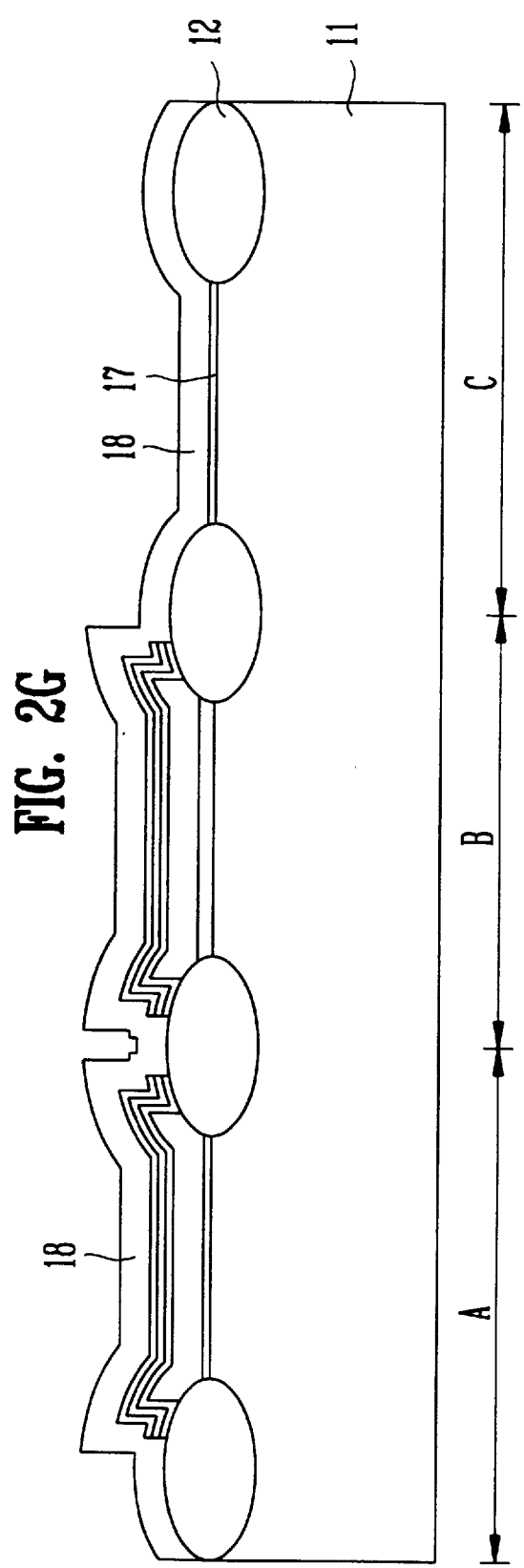

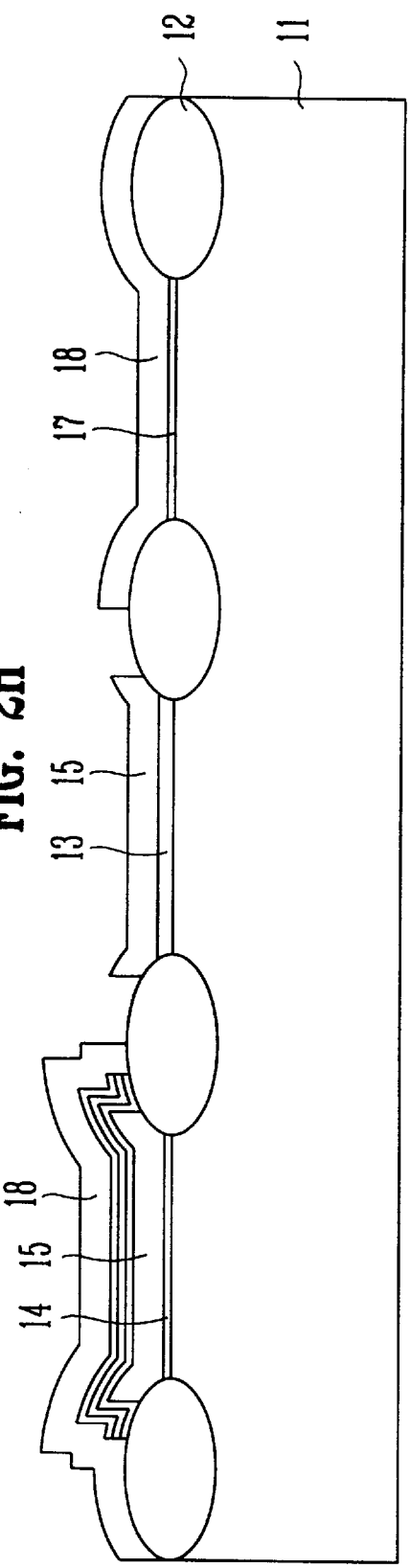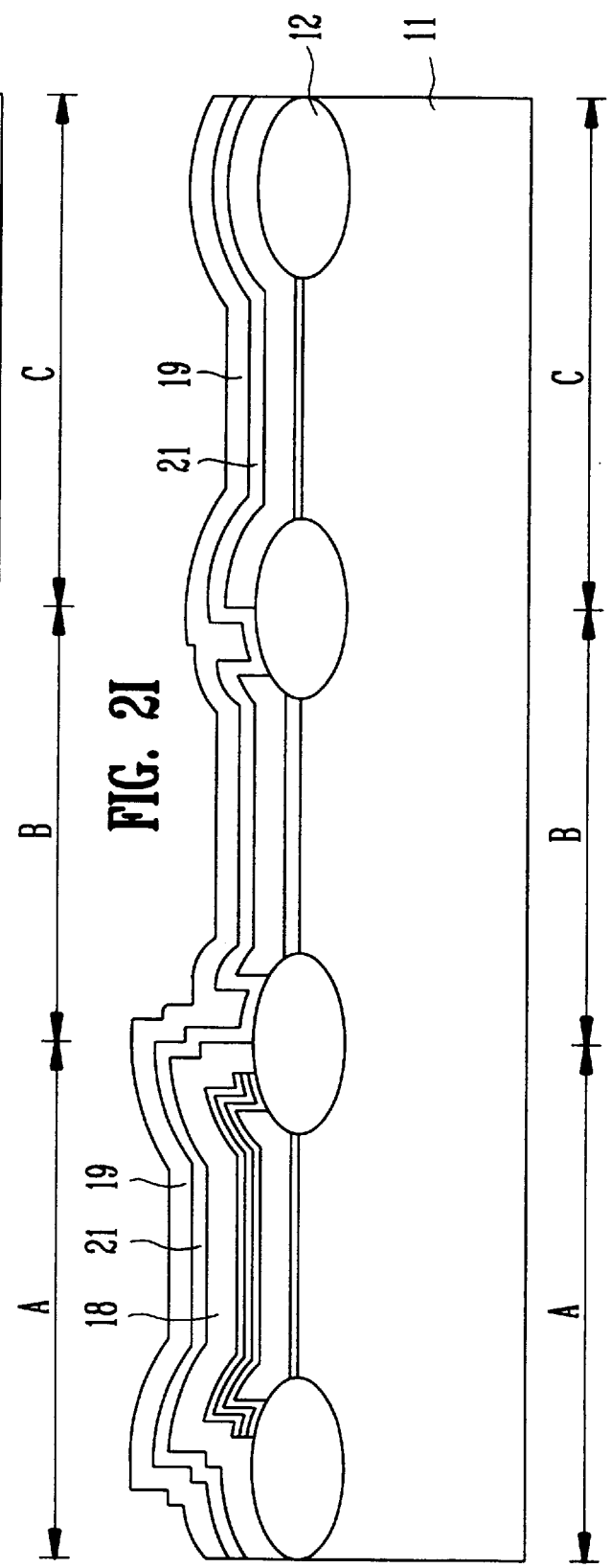

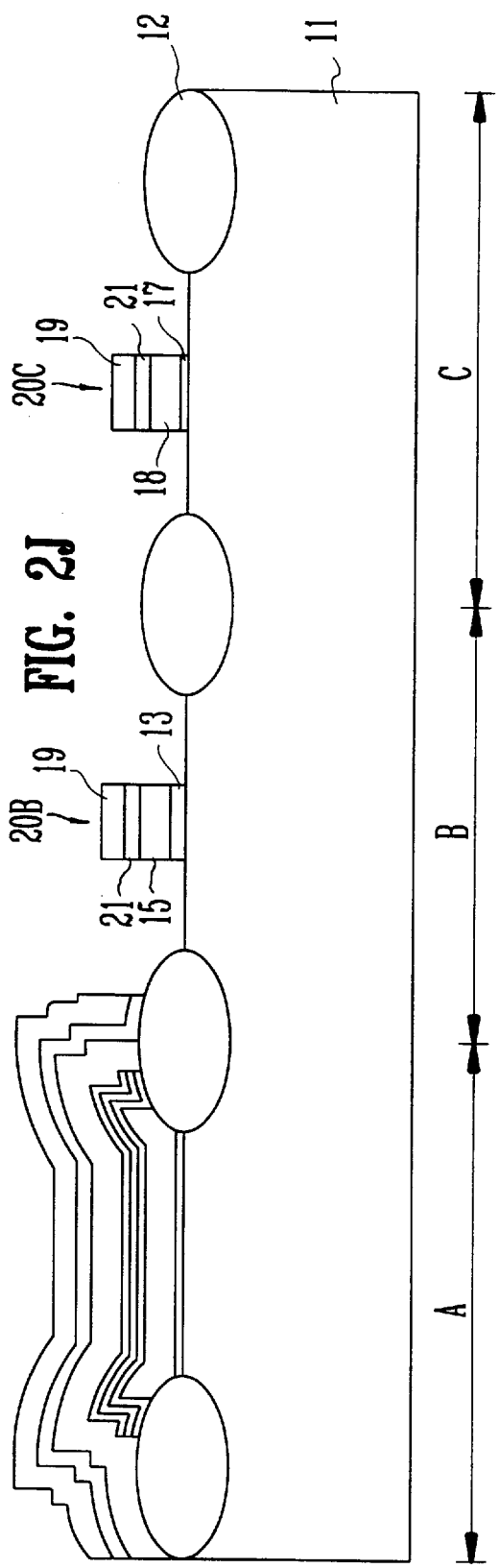
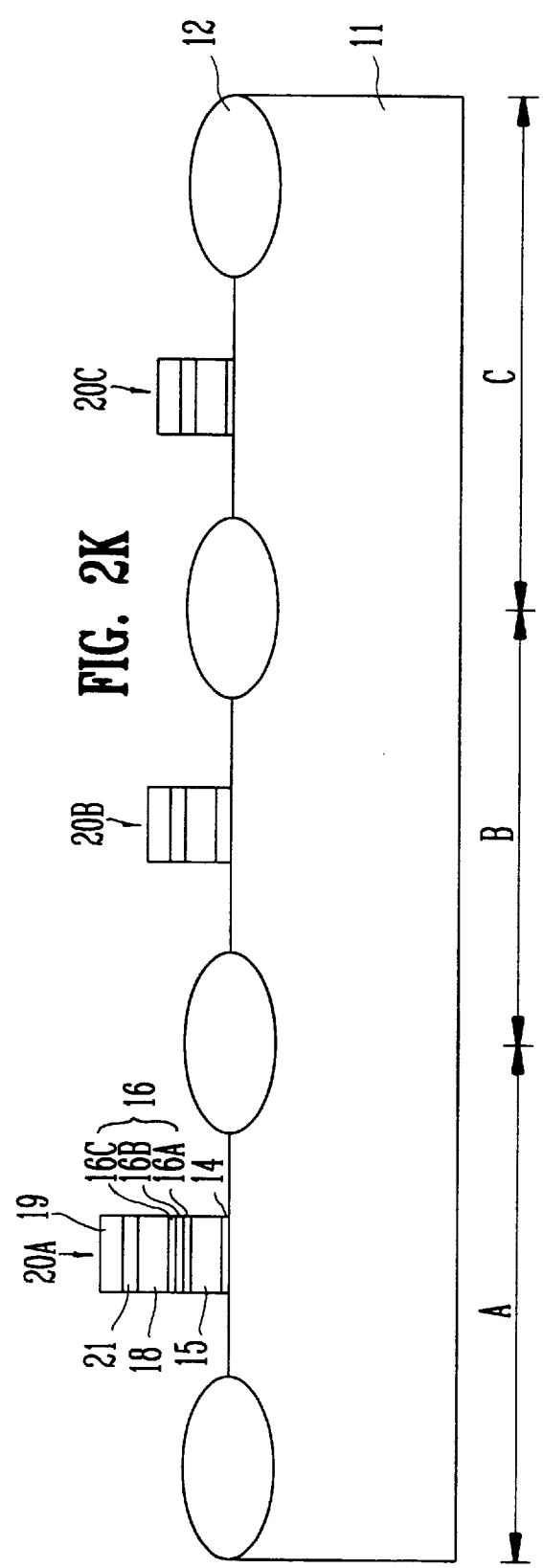

METHOD OF FABRICATING A FLASH MEMORY DEVICE

BACKGROUND OF THE INVENTION

1. Field of the Invention

The present invention relates to a method of fabricating a flash memory device, and more particularly to a method of fabricating a flash memory device which can minimize damage of a dielectric film in the process of forming a high voltage transistor and a low voltage transistor having gate electrode consisted of a polysilicon layer and a silicide layer.

2. Brief Description of the Prior Art

Generally, in a memory device, a gate electrode must have a two-layer structure of a polysilicon layer and a silicide layer for realizing a high programming and an erasure operations, and also a low voltage transistor having a gate oxide film with a thickness of 30 to 150 Å and a high voltage transistor having a gate oxide film with a thickness of 150 to 300 Å are formed in the flash EEPROM cell.

Then, a method of fabricating a conventional flash memory device comprising a high voltage and low voltage transistors which have gate electrode consisted of a polysilicon layer/a silicide layer, respectively, will be explained below in detail by reference to the accompanying drawings.

FIGS. 1A through 1L are sectional views for illustrating step by step a method of fabricating a conventional flash memory device.

An oxide film 3 is formed on a silicon substrate 1 which is divided into a memory cell region A, a high voltage transistor region B and a low voltage transistor region C by field oxide films 2 (FIG. 1A).

The oxide film 3 in a memory cell region A is removed so that the silicon substrate 1 in the memory cell region A is exposed (FIG. 1B). A tunnel oxide film 4 is formed in the memory cell region A, a first polysilicon layer 5 is then formed on the entire structure including the field oxide films 2 (FIG. 1C). Then, the first polysilicon layer 5 formed on the high voltage and the low voltage transistors regions B and C is removed, therefore, the first polysilicon layer 5 on the tunnel oxide film 4 is remained (FIG. 1D).

A dielectric film 6 having ONO structure of a lower oxide film 6A, a nitride film 6B and a upper oxide film 6C is formed on the entire structure including the field oxide layers 2 (FIG. 1E). And then, the dielectric film 6 formed in the high voltage and the low voltage transistor regions B and C is selectively removed, and the first cleaning process is performed (FIG. 1F). Then, ions are injected in the high voltage and the low voltage transistors B and C and the second cleaning process is performed. The oxide film 3 formed in the high voltage and the low voltage transistors B and C is removed by use of HF (FIG. 1G). At this time, as can be seen from FIG. 1G, the upper oxide film 6C of the dielectric layer 6 formed in the memory cell region A is also removed in the process of removing the oxide film 3 by use of HF.

An then, a middle oxide film 6D is formed on the entire structure except for the field oxide films 2 (FIG. 1H), the middle oxide film 6D formed in the memory cell region A and the ow voltage transistor region C is removed and the third cleaning process is performed (FIG. 1I). During the third cleaning process, the nitride film 6B of the dielectric film 6 formed in the memory cell region A is damaged.

Then, a gate oxide film 7 is formed in the low voltage transistor region C. At this time, an upper oxide film 6C is formed again on the nitride film 6B, therefore, the dielectric film 6 having an ONO structure is formed in the memory cell region A.

A second polysilicon layer 8 and a silicide layer 9 are sequentially formed on the entire structure including the field oxide film 2 (FIG. 1K), the second polysilicon layer 8 and the silicide layer 9 are patterned so gate electrodes 10B and 10C are formed in the high voltage and the low voltage transistors B and C (FIG. 1L). A gate electrode 10A is formed in the active region of the memory cell region A by patterning process.

As described above, in the process of forming the gate electrodes 10A, 10B and 10C in the memory cell region A, the high voltage transistor region B and the low voltage transistor region C, respectively, the dielectric film 6 formed in the memory cell region A is damaged by cleaning solutions which is used for the cleaning processes. Therefore, the characteristic of the device is degraded.

SUMMARY OF THE INVENTION

Accordingly, an object of the present invention is to provide a method of fabricating a flash memory device which can form an uniform dielectric film without damage in the process of forming a gate electrode.

In order to achieve to above object, the present invention comprises steps of forming an oxide film on a silicon substrate divided into a memory cell region, a high voltage transistor region and a low voltage transistor region by field oxide films; removing the oxide film formed in the memory cell region and forming a tunnel oxide film on the exposed silicon substrate; forming a first polysilicon layer on the entire structure including the field oxide films and removing some of the first polysilicon layer to remain the first polysilicon layer in active regions of the memory cell region and the high voltage transistor region; forming a dielectric film having an ONO structure on the entire structure including the field oxide films; removing the dielectric film formed in the low voltage transistor region and performing a cleaning process: forming a gate oxide film in the low voltage transistor region and forming a second polysilicon layer on the entire structure; removing the second polysilicon layer and the dielectric film formed in the high voltage transistor region and performing a cleaning process; sequentially forming a third polysilicon layer and a silicide layer on the entire structure; forming gate electrodes in the memory cell region, the high voltage transistor region and the low voltage transistor region by patterning process, respectively. The third polysilicon layer may not be formed if a thickness of the first and second polysilicon layers and is enough.

BRIEF DESCRIPTION OF THE DRAWINGS

Other objects and advantages of the present invention will be understood by reading the detailed explanation of the embodiment with reference to the accompanying drawings in which:

FIGS. 1A through 1M are sectional views of device for illustrating a conventional method of fabricating a flash memory device.

FIGS. 2A through 2K are sectional views of device for illustrating a method of fabricating a flash memory device in accordance with the present invention.

DESCRIPTION OF THE INVENTION

Figure 1A:
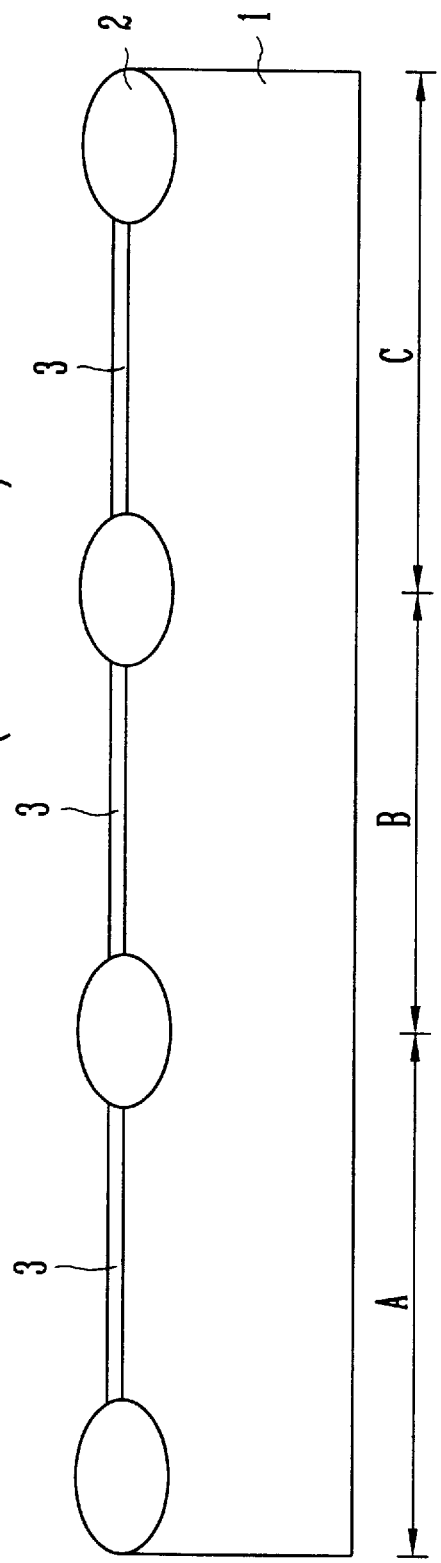
Figure 1B:
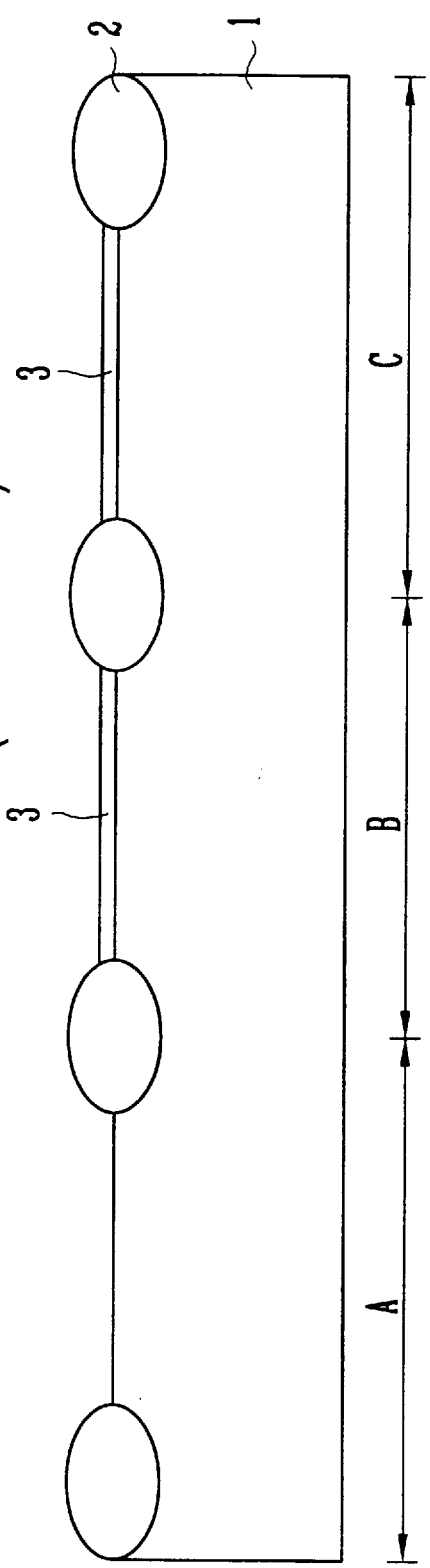
Figure 1K:
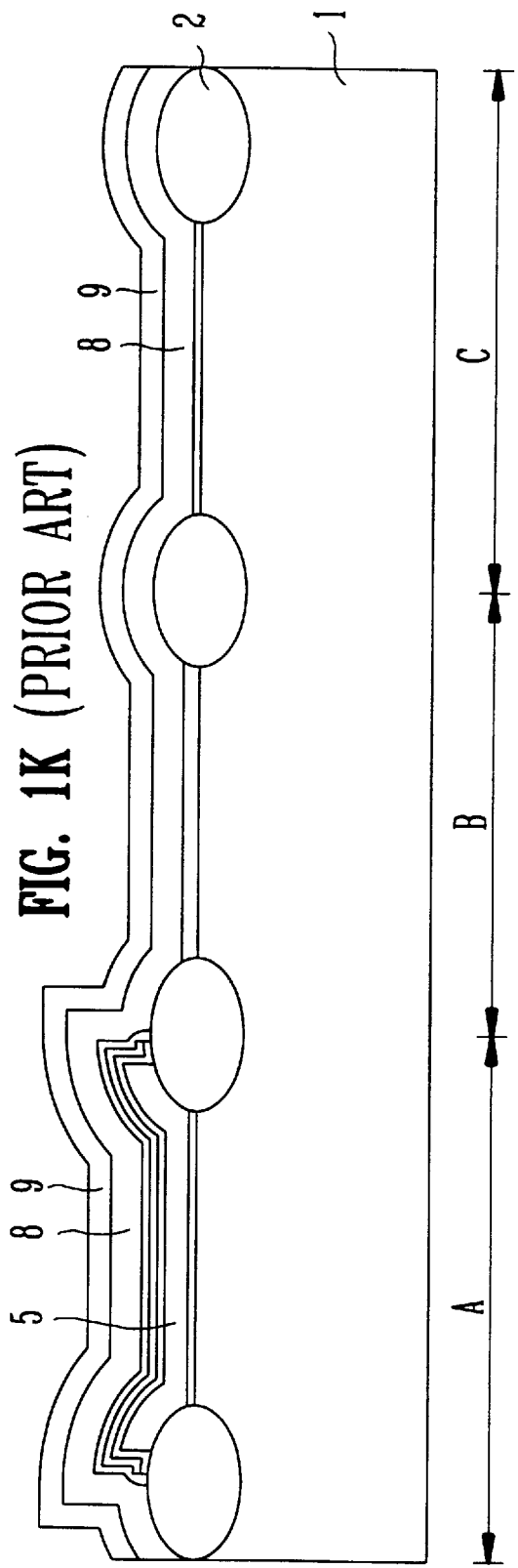
Figure 1L:
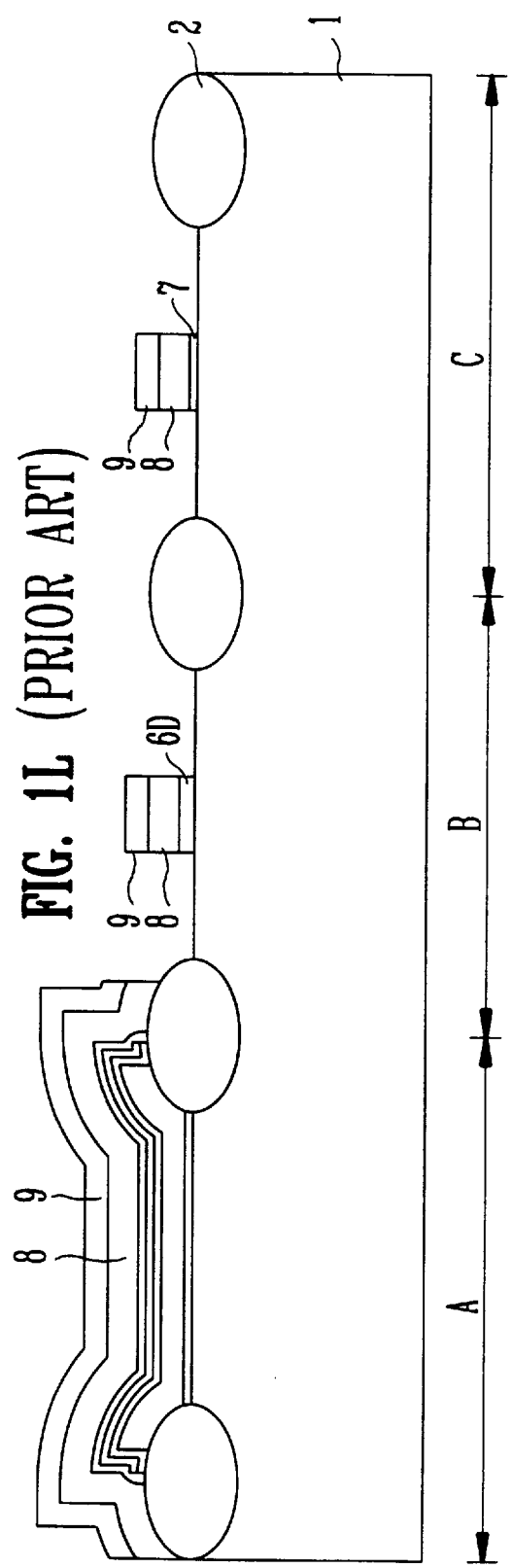

The present invention will be described below in detail by reference to the accompanying drawings.

FIGS. 2A through 2K are sectional views of device for illustrating a method of fabricating a flash memory device in accordance with the present invention.

An oxide film 13 is formed on a silicon substrate 11 which is divided into a memory cell region A, a high voltage transistor region B and a low voltage transistor region C by field oxide films 12 (FIG. 2A). The oxide film 13 formed in the memory cell region A is removed so that the silicon substrate 11 is exposed, and a tunnel oxide film 14 is formed on the exposed silicon substrate 11 (FIG. 2B). Then a first polysilicon layer 15 is formed on the entire structure including the field oxide films 12 (FIG. 2C), and some of the first polysilicon layer 15 is removed to remain the first polysilicon layer 15 in the active regions of the memory cell region A and the high voltage transistor region B (FIG. 2D).

A dielectric film 16 having ONO structure of a lower oxide film 16A, a nitride film 16B and an upper oxide film 16C is formed on the entire structure including the field oxide films 12 (FIG. 2E). Thereinafter, the dielectric film 16 formed in the low voltage transistor region C is removed, and then a cleaning process is performed (FIG. 2F). At this time, the upper oxide film 16C of the dielectric film 16 formed in the memory cell region A is damaged by a cleaning solution.

A gate oxide film 17 is formed in the low voltage transistor region C, and a second polysilicon layer 18 is formed on the entire structure (FIG. 2G). Then, the second polysilicon layer 18 and the dielectric film 16 which are formed in the high voltage transistor region B are sequentially removed, and then a cleaning process is performed (FIG. 2H).

A third polysilicon layer 21 and a silicide layer 19 is formed sequentially on the entire structure (FIG. 2I). A gate electrode 20B consisted of the oxide film 13, the first polysilicon layer 15 the third polysilicon layer 21 and the silicide layer 19 is formed in the high voltage transistor region B, and a gate electrode 20C consisted of the gate oxide film 17, the second polysilicon layer 18, the third polysilicon layer 21 and the silicide layer 19 is formed in the low voltage transistor region C, respectively, by the patterning process. Also, a gate electrode 20A which is consisted of the tunnel oxide film 14, the first polysilicon layer 15, the dielectric film 16, the second and third polysilicon layers 18 and 21 and the silicide layer 19 in stacked is formed in the memory cell region A (FIG. 2K) through the patterning process.

As mentioned above, during process for forming gate electrodes 20A, 20B and 20C according to the present invention, since the dielectric film 16 formed in the memory cell region A, especially the upper oxide film 16C, is only exposed to the cleaning solution which is used in cleaning process preformed after removing the dielectric film formed in the low voltage transistor region C, the number of damages applied to the dielectric film 16 can be minimized, therefore, a good dielectric film can be obtained.

In the above description, although the third polysilicon layer 21 is formed on the second polysilicon layer 18 (at the gate electrodes 20A and 20C) or the first polysilicon layer 15 (at the gate electrode 20B), the third polysilicon layer 21 may not be formed if a thickness of the first and second polysilicon layers 15 and 18 is enough.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of fabricating a flash memory device, comprising the sequential steps of:

forming an oxide film on a silicon substrate divided into a memory cell region, a high voltage transistor region and a low voltage transistor region by field oxide films;

removing the oxide film formed in the memory cell region and forming a tunnel oxide film on the exposed silicon substrate;

forming a first polysilicon layer on the entire structure including the field oxide films and removing some of the first polysilicon layer to leave the first polysilicon layer in active regions of the memory cell region and the high voltage transistor region;

forming a dielectric film having an ONO structure on the entire structure including the field oxide films;

removing the dielectric film formed in the low voltage transistor region and performing a cleaning process:

forming a gate oxide film in the low voltage transistor region and forming a second polysilicon layer on the entire structure;

removing the second polysilicon layer and the dielectric film formed in the high voltage transistor region and performing a cleaning process;

sequentially forming a third polysilicon layer and a silicide layer on the entire structure;

forming gate electrodes in the memory cell region, the high voltage transistor region and the low voltage transistor region by patterning process, respectively.

2. A method of fabricating a flash memory device, comprising the sequential steps of:

forming an oxide film on a silicon substrate divided into a memory cell region, a high voltage transistor region and a low voltage transistor region by field oxide films;

removing the oxide film formed in the memory cell region and forming a tunnel oxide film on the exposed silicon substrate;

forming a first polysilicon layer on the entire structure including the field oxide films and removing some of the first polysilicon layer to leave the first polysilicon layer in active regions of the memory cell region and the high voltage transistor region;

forming a dielectric film having an ONO structure on the entire structure including the field oxide films;

removing the dielectric film formed in the low voltage transistor region and performing a cleaning process:

forming a gate oxide film in the low voltage transistor region and forming a second polysilicon layer on the entire structure;

removing the second polysilicon layer and the dielectric film formed in the high voltage transistor region and performing a cleaning process;

forming a third polysilicon layer on the entire structure;

forming gate electrodes in the memory cell region, the high voltage transistor region and the low voltage transistor region by patterning process, respectively.

* * * * *